(12) United States Patent
Chang et al.

(10) Patent No.: US 10,418,148 B2
(45) Date of Patent: *Sep. 17, 2019

(54) LOW LOSS PRE-PREGS AND LAMINATES AND COMPOSITIONS USEFUL FOR THE PREPARATION THEREOF

(71) Applicant: Arlon LLC, Rogers, CT (US)

(72) Inventors: Daniel Chang, Fullerton, CA (US); Sam Najjar, Yucaipa, CA (US)

(73) Assignee: Arlon LLC, Rogers, CT (US)

( * ) Notice: Subject to any disclaimer, the term of this patent is extended or adjusted under 35 U.S.C. 154(b) by 166 days.

This patent is subject to a terminal disclaimer.

(21) Appl. No.: 15/620,028

(22) Filed: Jun. 12, 2017

(65) Prior Publication Data

US 2017/0287589 A1 Oct. 5, 2017

Related U.S. Application Data

(62) Division of application No. 14/163,527, filed on Jan. 24, 2014, now abandoned, and a division of application No. 12/483,166, filed on Jun. 11, 2009, now Pat. No. 8,658,719.

(51) Int. Cl.

| | |
|---|---|
| *H01B 3/40* | (2006.01) |
| *C08J 5/24* | (2006.01) |
| *C08L 79/04* | (2006.01) |
| *C08K 3/36* | (2006.01) |
| *H05K 1/03* | (2006.01) |
| *H05K 1/02* | (2006.01) |
| *C08K 5/523* | (2006.01) |

(52) U.S. Cl.
CPC ............ *H01B 3/40* (2013.01); *C08J 5/24* (2013.01); *H05K 1/0298* (2013.01); *H05K 1/03* (2013.01); *H05K 1/0353* (2013.01); *H05K 1/0373* (2013.01); *C08J 2379/04* (2013.01); *C08K 3/36* (2013.01); *C08K 5/523* (2013.01); *C08L 79/04* (2013.01); *H05K 2201/012* (2013.01); *Y10T 428/249955* (2015.04); *Y10T 428/31511* (2015.04); *Y10T 428/31525* (2015.04); *Y10T 428/31529* (2015.04); *Y10T 428/31721* (2015.04); *Y10T 428/31725* (2015.04); *Y10T 428/31786* (2015.04); *Y10T 428/31931* (2015.04); *Y10T 442/20* (2015.04); *Y10T 442/2475* (2015.04)

(58) Field of Classification Search
None
See application file for complete search history.

(56) References Cited

U.S. PATENT DOCUMENTS

| | | | |
|---|---|---|---|
| 5,358,992 A | 10/1994 | Dershem et al. | |
| 5,447,988 A | 9/1995 | Dershem et al. | |
| 5,489,641 A | 2/1996 | Dershem | |
| 5,646,241 A | 7/1997 | Dershem et al. | |
| 5,718,941 A | 2/1998 | Dershem et al. | |
| 5,753,748 A | 5/1998 | Dershem et al. | |
| 6,174,589 B1 | 1/2001 | Kawakita et al. | |
| 8,658,719 B2 * | 2/2014 | Chang ................... | C08J 5/24 524/140 |
| 2003/0125433 A1 | 7/2003 | Tamura et al. | |
| 2005/0019554 A1 | 1/2005 | Orikabe et al. | |
| 2005/0049350 A1 | 3/2005 | Tonapi et al. | |
| 2005/0228087 A1 | 10/2005 | Murakami et al. | |
| 2005/0250916 A1 | 11/2005 | Choate et al. | |
| 2006/0093824 A1 | 5/2006 | Nozaki | |
| 2006/0147719 A1 | 7/2006 | Rubinsztajn et al. | |
| 2006/0167142 A9 | 7/2006 | Campbell et al. | |
| 2007/0060674 A1 | 3/2007 | Wakizaka et al. | |
| 2007/0178300 A1 | 8/2007 | Amla et al. | |
| 2007/0203308 A1 | 8/2007 | Mori et al. | |
| 2008/0009211 A1 | 1/2008 | Himes et al. | |
| 2008/0039560 A1 | 2/2008 | Mills et al. | |
| 2008/0166511 A1 | 7/2008 | Honma et al. | |
| 2009/0072207 A1 | 3/2009 | Cho et al. | |
| 2009/0082494 A1 | 3/2009 | Kaprinidis | |
| 2009/0170983 A1 | 7/2009 | Tada et al. | |
| 2009/0247032 A1 | 10/2009 | Mori et al. | |
| 2010/0233495 A1 | 9/2010 | Mizuno et al. | |

FOREIGN PATENT DOCUMENTS

| | | |
|---|---|---|
| JP | 2007270151 | 4/2007 |
| WO | WO2006006593 | 1/2006 |

OTHER PUBLICATIONS

International Search Report and Written Opinion dated Oct. 15, 2010 for International Application No. PCT/US10/38031.
Asano et al., machine translation of JP2007270151; Apr. 26, 2007.
European Search Report dated Jun. 5, 2018 for corresponding European Patent Application No. 17206639.1.

* cited by examiner

*Primary Examiner* — Sheeba Ahmed
(74) *Attorney, Agent, or Firm* — Alix, Yale & Ristas, LLP

(57) ABSTRACT

In accordance with the present invention, compositions are described which are useful, for example, for the preparation of metal-clad laminate structures, methods for the preparation thereof, and various uses therefor. Invention metal-clad laminate structures are useful, for example, in the multilayer board (MLB) industry, in the preparation of burn-in test boards and high reliability boards, in applications where low coefficient of thermal expansion (CTE) is beneficial, in the preparation of boards used in down-hole drilling, and the like.

31 Claims, No Drawings

LOW LOSS PRE-PREGS AND LAMINATES AND COMPOSITIONS USEFUL FOR THE PREPARATION THEREOF

RELATED APPLICATIONS

This application is a divisional of U.S. application Ser. No. 14/163,527 filed Jan. 24, 2014, which is a divisional of U.S. application Ser. No. 12/483,166 filed Jun. 11, 2009.

FILED OF THE INVENTION

The present invention relates to low loss pre-preg materials and laminates prepared therefrom, as well as compositions useful for the preparation thereof.

SUMMARY OF THE INVENTION

In accordance with the present invention, there are provided novel compositions which are useful, for example, for the preparation of metal-clad laminate structures, methods for the preparation thereof, and various uses therefor. Invention metal-clad laminate structures are useful, for example, in the multi-layer board (MLB) industry, in the preparation of burn-in test boards and high reliability boards, applications where low coefficient of thermal expansion (CTE) is beneficial, in the preparation of boards used in down-hole drilling, and the like.

For example, materials employed in the preparation of equipment used in cellular telecommunications, laminate-based chip carriers, and the like, must meet a number of criteria, including electrical performance criteria (e.g., low loss, low dielectric constant, and the like), physical performance criteria (e.g., good heat resistance, good dimensional stability without substantial loss of other desirable performance properties, good adhesion to substrate(s), toughness, and the like), and will also be environmentally friendly (e.g., substantially halogen-free, lead-free, low volatile organic carbon, and the like).

In view of the high demand and widespread use of such materials, in addition to meeting the above-described electrical and physical performance properties, it is further desirable that such materials can be prepared from relatively inexpensive starting materials employing readily scalable, low cost processes. The present invention addresses these and other needs as described in greater detail herein.

DETAILED DESCRIPTION OF THE INVENTION

In accordance with one aspect of the present invention, there are provided compositions comprising:
(a) a first resin which, upon curing, forms a triazine structure,
(b) an optional second resin which, when present, modifies the electrical, mechanical and/or thermal properties of said composition,
(c) a substantially halogen-free, phosphorus-containing flame retardant having an atomic phosphorus content in the range of about 1-20 weight percent, based on the total weight of the resin components (i.e., (a)+(b)), and
(d) a quantity of particulate filler(s) consistent with the desired electrical and/or physical properties of said composition (e.g., dielectric constant and/or loss factor thereof);
wherein said composition has a low dielectric constant and a low dielectric loss factor.

As used herein, "substantially halogen-free" refers to materials having a halogen content of no greater than about 1000 ppm halogen; with materials having a halogen content of no greater than about 500 ppm halogen being preferred; and materials having a halogen content of no greater than about 100 ppm being especially preferred.

Invention compositions can be employed in a number of applications, e.g., for the preparation of electrical laminates for the manufacture of printed circuit boards, and the like. Among the many benefits of invention compositions is the fact that such compositions, when applied to a suitable metal substrate across different metal weights and thicknesses, have excellent adhesion properties, typically displaying peel strengths of at least 3 pounds/inch, and preferably displaying peel strengths of 5 or more pounds/inch across different metal weights and thicknesses (e.g., copper thicknesses as low as 0.5 ounce are suitable).

Exemplary first resin materials contemplated for use herein, i.e., resins which, upon curing, form a triazine structure, are typically derived from cyanate esters. Exemplary cyanate ester resins contemplated for use in the practice of the present invention include resins prepared from compounds such as those described in U.S. Pat. Nos. 5,358,992, 5,447,988, 5,489,641, 5,646,241, 5,718, 941 and 5,753,748, each of which are hereby incorporated by reference herein in their entirety. For instance, cyanate esters useful as a component in the invention compositions include dicyanatobenzenes, tricyanatobenzenes, dicyanatonaphthalenes, tricyanatonaphthalenes, dicyanato-biphenyl, bis(cyanatophenyl)methanes and alkyl derivatives thereof, bis(dihalocyanatophenyl)propanes, bis(cyanatophenyl)ethers, bis(cyanatophenyl)sulfides, bis(cyanatophenyl)propanes, phosphorus-containing cyanate esters (e.g., tris(cyanatophenyl)phosphites, tris(cyanatophenyl)phosphates, and the like), bis(halocyanatophenyl)methanes, cyanated novolac, bis[cyanatophenyl(methylethylidene)]benzene, cyanated bisphenol-terminated thermoplastic oligomers, and the like, as well as combinations of any two or more thereof.

More specifically contemplated for use herein are aryl compounds having at least one cyanate ester group on each molecule; such compounds may generally be represented by the formula $Ar(OCN)_m$, where Ar is an aromatic radical and m is an integer from 2 to 5. The aromatic radical Ar should contain at least 6 carbon atoms, and may be derived, for example, from aromatic hydrocarbons, such as phenyl, biphenyl, naphthalene, anthracene, or the like. The aromatic radical Ar may also be derived from a polynuclear aromatic hydrocarbon in which at least two aromatic rings are attached to each other through a bridging group. Also included are aromatic radicals derived from novolac-type phenolic resins—i.e., cyanate esters of these phenolic resins. Ar may also contain further ring-attached, non-reactive substituents.

Examples of such cyanate esters include, for instance, 1,3-dicyanatobenzene; 1,4-dicyanatobenzene; 1,3,5-tricyanatobenzene; 1,3-, 1,4-, 1,6-, 1,8-, 2,6- or 2,7-dicyanatonaphthalene; 1,3,6-tricyanatonaphthalene; 4,4'-dicyanatobiphenyl; bis(4-cyanatophenyl)methane and 3,3',5,5'-tetramethyl bis(4-cyanatophenyl)methane; 2,2-bis(3,5-dichloro-4-cyanatophenyl)propane; 2,2-bis(3,5-dibromo-4-dicyanatophenyl)propane; bis(4-cyanatophenyl)ether; bis(4-cyanatophenyl)sulfide; 2,2-bis(4-cyanatophenyl)propane; tris(4-cyanatophenyl)-phosphite; tris(4-cyanatophenyl) phosphate; bis(3-chloro-4-cyanatophenyl)methane; cyanated novolac; 1,3-bis[4-cyanatophenyl-1-(methylethylidene)]benzene, cyanated bisphenol-terminated polycarbonate or other thermoplastic oligomer, and the like, as well as combinations of any two or more thereof.

Particularly desirable cyanate esters contemplated for use herein are available commercially under the tradename "AROCY" [1,1-di(4-cyanatophenylethane)]. The structures of three "AROCY" cyanate esters are shown below:

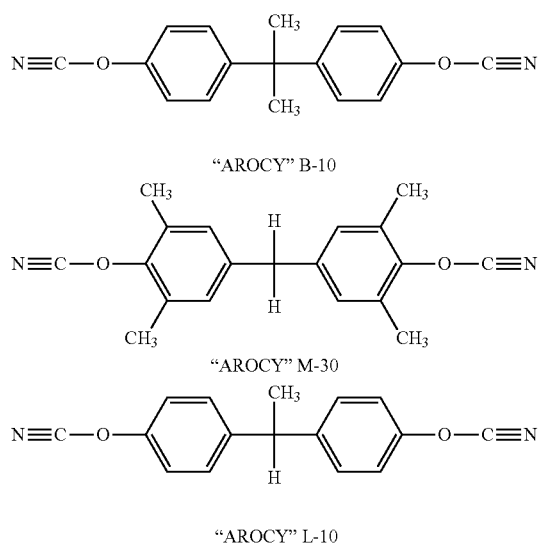

"AROCY" B-10

"AROCY" M-30

"AROCY" L-10

Presently preferred cyanate ester monomers from which the triazines are prepared include bisphenol-A cyanate esters, hexafluorobisphenol-A cyanate esters, bisphenol-E cyanate esters, tetramethylbisphenol-F cyanate esters, bisphenol-M cyanate esters, phenol Novolac cyanate esters, bisphenol-C cyanate esters, dicyclopentadienyl-bisphenol cyanate esters, Novolac cyanate esters, and the like, as well as mixtures of any two or more thereof.

Optional second resins contemplated for use herein include resins which, when present in invention formulations, modify the low dielectric loss factor and the dielectric constant of the resulting composition. Exemplary second resins include polyphenylene oxides, styrene-maleic anhydride co-polymers, carboxy-terminated butadiene nitrile resins, multifunctional epoxies, low-halogen epoxies, bis-maleimides, and the like, as well as mixtures of any two or more thereof.

Exemplary polyphenylene oxides contemplated for use herein include compounds of the structure:

-[Ph-O]$_n$- wherein Ph is an optionally substituted phenyl ring, and n falls in the range of about 10 up to about 200; with n in the range of about 10-100 presently preferred.

Exemplary styrene-maleic anhydride co-polymers contemplated for use herein include alternating co-polymers of the structure:

—[CH(Ph)-CH$_2$-SA]$_m$- as well as block co-polymers of the same components, wherein Ph is an optionally substituted phenyl ring, SA is an optionally substituted succinic anhydride residue, and m falls in the range of about 5 up to about 200; with m in the range of about 10-100 presently preferred.

Exemplary carboxy-terminated butadiene nitrile resins contemplated for use herein include compounds having one or more of the following repeating units:

—CH$_2$—CH=CH—CH$_2$—CH(CN)—CH$_2$— a sufficient number of carboxy groups (—C(O)OH) thereon to provide a carboxy functionality in the range of about 1-5, and an elastomer content of no greater than about 20% by weight.

Exemplary multifunctional epoxies contemplated for use herein include compounds containing multiple epoxide units, wherein curing of the individual epoxide units of the multifunctional epoxies creates a three dimensional network, resulting in a high Tg product. An exemplary multifunctional epoxy is a phenol novolac epoxy with pendent epoxide units on the side chains thereof.

As employed herein, "hydrocarbyl" refers to saturated or unsaturated radicals having 1 up to 20 carbon atoms, preferably 2-10 carbon atoms. Exemplary hydrocarbyl radicals include alkyl, alkylene, alkenyl, alkenylene, alkynyl, alkynylene, cycloalkyl, cycloalkylene, cycloalkenyl, cycloalkenylene, aryl, arylene, and the like. Similarly, "substituted hydrocarbyl" comprises saturated or unsaturated hydrocarbyl groups further bearing one or more substituents selected from hydroxy, alkoxy (of a lower alkyl group), mercapto (of a lower alkyl group), cycloalkyl, substituted cycloalkyl, heterocyclic, substituted heterocyclic, aryl, substituted aryl, heteroaryl, substituted heteroaryl, aryloxy, substituted aryloxy, halogen, trifluoromethyl, cyano, nitro, nitrone, amino, amido, C(O)H, acyl, oxyacyl, carboxyl, carbamate, sulfonyl, sulfonamide, sulfuryl, and the like.

Exemplary low-halogen epoxies contemplated for use herein include epoxies having a residual halogen content of no greater than 1000 ppm.

Exemplary bis-maleimides contemplated for use herein include maleimides having the structure:

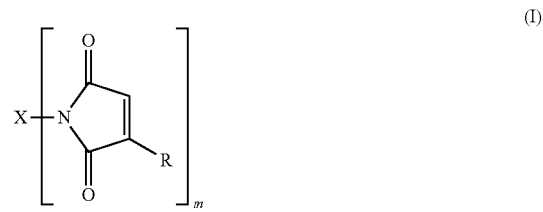

(I)

wherein:
X is optionally substituted alkylene, cycloalkylene, arylene, polyarylene, heteroarylene or polyheteroarylene,
each R is independently H or optionally substituted lower alkyl, and
m is at least 2 (up to about 10).

As employed herein, "alkyl" refers to hydrocarbyl radicals having 1 up to 20 carbon atoms, preferably 2-10 carbon atoms; and "substituted alkyl" comprises alkyl groups further bearing one or more substituents selected from hydroxy, alkoxy (of a lower alkyl group), mercapto (of a lower alkyl group), cycloalkyl, substituted cycloalkyl, heterocyclic, substituted heterocyclic, aryl, substituted aryl, heteroaryl, substituted heteroaryl, aryloxy, substituted aryloxy, halogen, trifluoromethyl, cyano, nitro, nitrone, amino, amido, C(O)H, acyl, oxyacyl, carboxyl, carbamate, sulfonyl, sulfonamide, sulfuryl, and the like.

As employed herein, "lower alkyl" refers to hydrocarbyl radicals having 1 up to 6 carbon atoms, preferably 1-4 carbon atoms; and "substituted lower alkyl" comprises lower alkyl groups further bearing one or more substituents as described herein.

As employed herein, "alkylene" refers to divalent hydrocarbyl radicals having 1 up to 20 carbon atoms, preferably 2-10 carbon atoms; and "substituted alkylene" comprises alkylene groups further bearing one or more substituents as set forth above.

As employed herein, "cycloalkylene" refers to divalent cyclic ring-containing groups containing in the range of about 3 up to 8 carbon atoms, and "substituted cycloalkylene" refers to cycloalkylene groups further bearing one or more substituents as set forth above.

As employed herein, "arylene" refers to divalent aromatic groups having in the range of 6 up to 14 carbon atoms and "substituted arylene" refers to arylene groups further bearing one or more substituents as set forth above.

As employed herein, "polyarylene" refers to a divalent moiety comprising a plurality (i.e., at least two, up to about 10) divalent aromatic groups (each having in the range of 6 up to 14 carbon atoms), wherein said divalent aromatic groups are linked to one another directly, or via a 1-3 atom linker; and "substituted polyarylene" refers to polyarylene groups further bearing one or more substituents as set forth above.

As employed herein, "heteroarylene" refers to divalent aromatic groups containing one or more heteroatoms (e.g., N, O, S, or the like) as part of the ring structure, and having in the range of 3 up to 14 carbon atoms; and "substituted arylene" refers to arylene groups further bearing one or more substituents as set forth above.

As employed herein, "polyheteroarylene" refers to a divalent moiety comprising a plurality (i.e., at least two, up to about 10) heteroarylene groups (each containing at least one heteroatom, and in the range of 3 up to 14 carbon atoms), wherein said heteroarylene groups are linked to one another directly, or via a 1-3 atom linker; and "substituted polyheteroarylene" refers to polyheteroarylene groups further bearing one or more substituents as set forth above.

In some embodiments of the present invention, X of the above-described crosslinkable maleimide is optionally substituted alkylene.

In other embodiments of the present invention, X of the above-described crosslinkable maleimide is optionally substituted cycloalkylene.

In still other embodiments of the present invention, X of the above-described crosslinkable maleimide is optionally substituted arylene.

In yet other embodiments of the present invention, X of the above-described crosslinkable maleimide is optionally substituted bis-arylene. Exemplary bis-arylene compounds contemplated for use in the practice of the present invention have the structure:

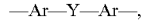

wherein:
each Ar is independently phenylene or substituted phenylene, and
Y is a bond, —O—, —S(O)$_m$, wherein m is 0, 1 or 2, or —(CR'$_2$)$_x$—, wherein each R' is independently H, halogen, or optionally substituted lower alkyl, and x is 1-10.

In presently preferred embodiments of the present invention, each Ar of the above-described bis-arylene moiety is optionally substituted phenylene, Y is —(CR'$_2$)$_x$—, each R' is independently H or lower alkyl, and x is 0 or 1. In particularly preferred embodiments, X is -Ph-CH$_2$-Ph-, and each phenylene is optionally substituted. Optional substitution of the phenylene moieties is preferably at the meta or para position.

Exemplary crosslinkable maleimides contemplated for use in the practice of the present invention are selected from the group consisting of N,N'-m-phenylene bismaleimide, N,N'-p-phenylene bismaleimide, N,N'-m-toluilene bismaleimide, N,N'-4,4'-biphenylene bismaleimide, N,N'-4,4'-[3,3'-dimethyl-biphenylene] bismaleimide, N,N'-4,4'-[3,3'-dimethyldiphenylmethane] bismaleimide, N,N'-4,4'-[3,3'-diethyldiphenylmethane] bismaleimide, N,N'-4,4'-diphenylmethane bismaleimide, N,N'-4,4'-diphenylpropane bismaleimide, N,N'-4,4'-diphenylether bismaleimide, N,N'-3,3'-diphenylsulfone bismaleimide, N,N'-4,4'-diphenylsulfone bismaleimide, 2,2-bis [4-(4-maleimidephenoxy) phenyl] nonane, 2,2-bis [3-tertiary butyl-4-(-maleimidephenoxy) phenyl] propane, 2,2-bis [3-secondary butyl-4-(4-maleimidephenoxy) phenyl] propane, 1,1-bis [4-(4-maleimidephenoxy) phenyl] decane, 1,1-bis [2-methyl-4-(4-maleimidephenoxy)-5-tertiary butyl phenyl]-2-methyl-propane, 4,4'-cyclohexylidene-bis [1-(4-maleimidephenoxy)-2-(1,1-dimethylethyl) benzene], 4,4'-methylene-bis [1-(4-maleimidephenoxy)-2,6-bis (1,1'-dimethylethyl) benzene], 4,4'-methylene-bis [1-(4-maleimidephenoxy)-2,6-di-secondary butyl benzene], 4,4'-cyclohexylidene-bis [1-(4-maleimidephenoxy)-2-cyclohexylbenzene], 4,4'-methylene-bis [1-(maleimidephenoxy)-2-nonylbenzene], 4,4'-(1-methylethylidene)-bis [1-(maleimidephenoxy)-2,6-bis (1,1'-dimethylethyl) benzene, 4,4'-(2-ethylhexylidene)-bis [1-(maleimidephenoxy)-benzene], 4,4'-(1-methylheptylidene)-bis [1-(maleimidephenoxy)-benzene], 4,4'-cyclohexylidene-bis [1-(maleimidephenoxy)-3-methylbenzene], and the like.

The relative weight ratios of the above-described components can vary widely. Typically, the weight ratio between (a) and (b), when (b) is present, is at least about 1:1 up to about 20:1. The composition of claim 1 wherein the weight ratio between (a) and (b), when (b) is present, falls in the range of about 2:1 up to about 10:1.

As employed herein, "about" means in quantitative terms plus or minus 10%.

Exemplary substantially halogen-free, phosphorus-containing compounds contemplated for use herein can be either reactive or non-reactive, and include organo-phosphates, phosphonates, phosphorus-based phenolic hardeners, phosphorus-containing cyanate esters, phosphorus-containing triazines, and the like, as well as mixtures of any two or more thereof.

Exemplary organo-phosphates contemplated for use herein include diphenyl phosphate, triphenyl phosphate, and the like, as well as mixtures of any two or more thereof.

Exemplary phosphonates contemplated for use herein include compounds such as m-phenylene methyl phosphonate.

Exemplary phosphorus-based phenolic hardeners contemplated for use herein include DOW XZ92741, and the like, as well as mixtures of any two or more thereof.

As readily understood by those of skill in the art, the atomic phosphorus content contemplated for use in the practice of the present invention can vary widely. Typically, the atomic phosphorus content will fall in the range of about 1-20 wt %, based on the total weight of components (a) and (b), taken together; preferably, the phosphorus content falls in the range of about 1-10 wt %, based on the total weight of components (a) and (b), taken together; and a phosphorus content in the range of about 3-5 wt % being presently preferred.

Alternatively, the amount of atomic phosphorus employed in the practice of the present invention can be expressed as the ratio of component (a):(c), wherein the ratio of (a):(c) will typically fall in the range of at least about 1:20 up to about 20:1. In some embodiments of the present invention, the weight ratio between (a) and (c) falls in the range of at least about 1:10 up to about 10:1. In other embodiments of the present invention, the weight ratio between (a) and (c) falls in the range of at least about 1:5 up to about 5:1. In still other embodiments of the present invention, the weight ratio between (a) and (c) falls in the range of about 1:1 up to about 3:1.

In certain embodiments of the present invention, the substantially halogen-free, phosphorus-containing flame retardant is supplemented by the presence of one or more nitrogen-containing synergist(s). Exemplary nitrogen-containing synergists contemplated for use herein include iso cyanurates, urea derivatives, melamine derivatives, phosphazene derivatives, nitrogen-containing phenolic resins, nitrogen-containing epoxy resins, and the like, as well as mixtures of any two or more thereof.

Additional flame retardants contemplated for optional use in the practice of the present invention include substantially halogen-free fire retardants, halogenated fire retardants, additive and/or reactive flame retardants which may serve as intumescents or char formers, silanes, siloxanes, low melting glasses, zinc-, boron-, aluminum-, or magnesium-based fire retardants, and the like.

Specific compounds contemplated for use as fire retardants include nitrogenes (e.g., melamine derivatives), bromine-containing fire retardants (e.g., brominated styrenes), zinc- and/or boron-based fire retardants (e.g., zinc borate, zinc stannate, borax, and the like), aluminum-based fire retardants (e.g., aluminum trihydrate (ATH)), magnesium-based fire retardants (e.g., magnesium hydroxide), and the like, as well as combinations of any two or more thereof.

Fillers contemplated for use in the practice of the present invention may be any of a variety of morphologies, e.g., angular, platelet, spherical, amorphous, sintered, fired, powder, flake, crystalline, ground, crushed, milled, and the like, or mixtures of any two or more thereof. Presently preferred particulate fillers contemplated for use herein are substantially spherical.

Such fillers may optionally be thermally conductive. Both powder and flake forms of filler may be used in the compositions of the present invention. Fillers having a wide range of particle sizes can be employed in the practice of the present invention. Typically particle sizes ranging from about 500 nm up to about 300 microns are employed, with particle sizes of less than about 100 microns being preferred, and particle sizes in the range of about 5 up to about 75 microns being particularly preferred.

Filler is typically present in the range of about 50 parts by weight up to about 400 parts by weight, relative to the total weight of the resin components of the composition. Preferably, the quantity of filler employed falls in the range of about 100 parts by weight up to about 350 parts by weight, relative to the total weight of the resin components of the composition, with quantities in the range of about 200 parts by weight, up to about 300 parts by weight being especially preferred. In certain embodiments of the invention, 275 parts filler by weight are especially preferred.

A wide variety of fillers can be employed in the practice of the present invention, e.g., soft fillers (e.g., uncalcined talc), naturally occurring minerals (e.g., aluminum nitride, boron nitride, silicon carbide, diamond, graphite, beryllium oxide, magnesia, silica, alumina, aluminum silicates, and the like), calcined naturally occurring minerals (e.g., enstatite), synthetic fused minerals (e.g., cordierite), treated fillers (e.g., silane-treated minerals), organic polymers (e.g., polytetrafluoroethylene), hollow spheres, microspheres, powdered polymeric materials, and the like.

Exemplary fillers include talc, mica, calcium carbonate, calcium sulfate, aluminum nitride, boron nitride, silicon carbide, diamond, graphite, beryllium oxide, magnesia, silica, alumina, $TiO_2$, aluminum silicate, aluminum-zirconium-silicate, cordierite, silane-treated mineral, polytetrafluoroethylene, polyphenylene sulfide, and the like.

Thermally conductive fillers contemplated for optional use in the practice of the present invention include, for example, aluminum nitride, boron nitride, silicon carbide, diamond, graphite, beryllium oxide, magnesia, silica, alumina, zirconium silicate, and the like. Preferably, the particle size of these fillers will be about 20 microns. If aluminum nitride is used as a filler, it is preferred that it be passivated via an adherent, conformal coating (e.g., silica, or the like).

Thermally conductive fillers are optionally (and preferably) rendered substantially free of catalytically active metal ions by treatment with chelating agents, reducing agents, nonionic lubricating agents, or mixtures of such agents. Such treatment is described in U.S. Pat. No. 5,447,988, which is incorporated by reference herein in its entirety.

Optionally, a filler may be used that is not a thermal conductor. Such fillers may be desirable to impart some other property to the adhesive formulation such as, for example, reduced thermal expansion of the cured adhesive, reduced dielectric constant, improved toughness, increased hydrophobicity, and the like. Examples of such fillers include perfluorinated hydrocarbon polymers (i.e., TEFLON™), thermoplastic polymers, thermoplastic elastomers, mica, fumed silica, fused silica, glass powder, and the like.

Invention compositions optionally include one or more additional components such as flexibilizers, anti-oxidants, dyes, pigments, surfactants, defoamers, silane coupling agents, dispersing agents, thixotropic agents, processing aids, flow modifiers, cure accelerators, strength enhancers, toughening agents, UV protectors (especially UV blocking dyes appropriate to enable Automatic-Optical Inspection (AOI) of Circuitry), and the like, as well as mixtures of any two or more thereof.

Flexibilizers (also called plasticizers) contemplated for use in certain embodiments of the present invention include compounds that reduce the brittleness of the formulation, such as, for example, branched polyalkanes or polysiloxanes that lower the glass transition temperature (Tg) of the formulation. Such plasticizers include, for example, polyethers, polyesters, polythiols, polysulfides, and the like. Plasticizers, when employed, are typically present in the range of about 0.5 wt. % up to about 30 wt. % of the formulation.

Anti-oxidants contemplated for use in the practice of the present invention include hindered phenols (e.g., BHT (butylated hydroxytoluene), BHA (butylated hydroxyanisole), TBHQ (tertiary-butyl hydroquinone), 2,2'-methylenebis(6-tertiarybutyl-p-cresol), and the like), hindered amines (e.g., diphenylamine, N,N'-bis(1,4-dimethylpentyl-p-phenylene diamine, N-(4-anilinophenyl) methacrylamide, 4,4'-bis(☐, ☐-dimethylbenzyl) diphenylamine, and the like), phosphites, and the like. When used, the quantity of anti-oxidant typically falls in the range of about 100 up to 2000 ppm, relative to the weight of the base formulation.

Dyes contemplated for use in certain embodiments of the present invention include nigrosine, Orasol blue GN, phthalocyanines, fluorescent dyes (e.g., Fluoral green gold dye, and the like), and the like. When used, organic dyes in relatively low amounts (i.e., amounts less than about 0.2% by weight) provide contrast.

Pigments contemplated for use in certain embodiments of the present invention include any particulate material added solely for the purpose of imparting color to the formulation, e.g., carbon black, metal oxides (e.g., $Fe_2O_3$, titanium oxide), and the like. When present, pigments are typically present in the range of about 0.5 wt. % up to about 5 wt. %, relative to the base formulation.

Flow modifiers may optionally be employed in the practice of the present invention to alter the melt rheology in order to facilitate achieving desired fill and/or lamination properties. Use of such optional additives may thereby (1) enhance the internal cohesion of the article, and/or (2) produce a multi-layered board by bonding resinous prepregs to layers comprising etched circuitry with enhanced interlaminar adhesion/bonding. When employed in accordance with the present invention, such additives are likely to be used at minimum loading levels (e.g., in the range of about 1 up to about 10 weight percent, based on the total weight of the formulation) to gain the benefit such additives can impart (e.g., enhanced heat and pressure induced flow) without compromising other physical and electrical properties.

Flow modifiers contemplated for use herein may be non-reactive or reactive (i.e., capable of participating in oxidative cross-linking). Such materials will desirably exhibit electrical and physical properties which are compatible with all of the components of the above-described compositions.

Exemplary flow modifiers contemplated for use in the practice of the present invention may be non-reactive or reactive, and include monomeric, oligomeric, or polymeric (i.e., thermoplastic) saturated (aliphatic) hydrocarbons, unsaturated hydrocarbons, and the like.

Cure accelerators contemplated for use in certain embodiments of the present invention include compounds which enhance the rate of cure of the base polymer system, such as, for example, catalytically active materials, and the like.

Strength enhancers contemplated for use in certain embodiments of the present invention include compounds which increase the performance properties of the polymeric material to which they are added, such as, for example, crosslinking agents, and the like.

Toughening agents contemplated for use in the practice of the present invention are materials which impart enhanced impact resistance to various articles. Exemplary toughening agents include synthetic rubber containing compounds such as Hypro, Hypox, and the like.

UV protectors contemplated for use in certain embodiments of the present invention include compounds which absorb incident ultraviolet (UV) radiation, thereby reducing the negative effects of such exposure on the resin or polymer system to which the protector has been added. Exemplary UV protectors include bis(1,2,2,6,6-pentamethyl-4-piperidinyl) sebacate, silicon, powdered metallic compounds, hindered amines (known in the art as "HALS"), and the like.

Defoamers contemplated for use in certain embodiments of the present invention include materials which inhibit formation of foam or bubbles when a liquid solution is agitated or sheared during processing. Exemplary defoamers contemplated for use herein include n-butyl alcohol, silicon-containing anti-foam agents, and the like.

Exemplary silane coupling agents contemplated for use in the practice of the present invention include materials which form a bridge between inorganic surfaces and reactive polymeric components, including materials such as epoxy silanes, amino silanes, and the like.

Exemplary dispersing agents contemplated for use in the practice of the present invention include materials which prevent agglomeration of particulate fillers (which would result in the formation of overly large localized clumps of filler), including surfactants.

Exemplary thixotropic agents contemplated for use in the practice of the present invention include materials which cause liquids to have the property of enhanced flow when shear is applied, including materials such as high surface area fillers (e.g., fumed silica) having particle sizes in the range about 2-3 microns, or even submicron size.

Exemplary processing aids contemplated for use in the practice of the present invention include materials which modify the ability of a formulation to be shaped, formed or otherwise manipulated, without substantially impacting the intrinsic properties of the formulation.

In accordance with yet another embodiment of the present invention, there are provided articles comprising a partially or fully cured layer of the above-described composition on a suitable substrate.

As readily recognized by those of skill in the art, a variety of substrates are suitable for use in the practice of the present invention, for example, polyesters, liquid crystalline polymers, polyamides (e.g., Aramids), polyimides, polyamide-imides, polyolefines, polyphenylene oxides, polyphenylene sulfides, polybenzoxazolines, conductive materials (e.g., conductive metals), and the like, as well as combinations of any two or more thereof.

When conductive metal substrates are employed, such materials as silver, nickel, gold, cobalt, copper, aluminum, alloys of such metals, and the like, are contemplated for use herein.

In accordance with still another embodiment of the present invention, there are provided methods of making the above-described articles (i.e., articles comprising composition according to the invention on a substrate), said methods comprising applying invention composition to a substrate and, if diluent is optionally employed to facilitate such application, removing substantially all diluent therefrom.

Optional diluents contemplated for use in the practice of the present invention include aromatic, aliphatic, cycloaliphatic, and the like, as well as combinations of any two or more thereof. As readily recognized by those of skill in the art, diluents may be reactive or non-reactive. Non-reactive diluents remain unchanged by the chemical processes that may occur in their presence, whereas reactive diluents participate in one way or another in the reaction, e.g., by dissolving one or more of the other reactants, by promoting reaction, or by being consumed as part of the reaction occurring in its presence.

Presently preferred diluents contemplated for optional use in the practice of the present invention are non-reactive diluents which are relatively non-polar. Exemplary diluents contemplated for use herein include methyl ethyl ketone (MEK), propylene glycol methyl ether (PM), propylene glycol methyl ether acetate (PMA), and the like, as well as mixtures of any two or more thereof.

In accordance with yet another embodiment of the present invention, there are provided prepregs produced by impregnating a porous substrate with a composition according to the invention, and, if diluent is optionally employed to facilitate such application, subjecting the resulting impregnated substrate to conditions suitable to remove substantially all of the diluent therefrom.

As readily recognized by those of skill in the art, a variety of porous substrates can be employed for the preparation of invention prepregs. For example, the substrate can be either woven or non-woven.

Exemplary materials employed for preparation of substrates contemplated for use herein include fiberglass, quartz, polyester fiber, polyamide fiber, polyimide fiber, polyamide-imide fiber, polyphenylene sulfide fiber, polyalkylene fiber, liquid crystalline polymer, poly(p-phenylene-2,6-benzobisoxazole), aramid fiber, polytetrafluoroethylene, a copolymer of tetrafluoroethylene and perfluoromethylvinyl ether (MFA), and the like, as well as mixtures of any two or more thereof.

Presently preferred materials employed for preparation of substrates contemplated for use herein include woven glass, non-woven glass, woven aramid fiber, non-woven aramid fiber, and the like.

In accordance with yet another embodiment of the present invention, there are provided methods of making prepregs comprising a porous substrate impregnated with a composition according to the invention, said methods comprising impregnating a porous substrate with invention composition, and, if diluent is optionally employed to facilitate such application, subjecting the resulting impregnated substrate to conditions suitable to remove substantially all of the diluent therefrom. The resulting resin content will typically fall in the range of about 25 up to about 90%.

As employed herein, the term "porous substrate" refers to a woven or non-woven substrate which can include, but is not limited to, woven glass, non-woven glass, woven aramid fibers, non-woven aramid fibers, woven liquid crystal polymer fibers, non-woven liquid crystal polymer fibers, woven synthetic polymer fibers, non-woven synthetic polymer fibers, randomly dispersed fiber reinforcements, expanded polytetrafluoroethylene (PTFE) structures and combinations of any two or more thereof. Specifically, materials contemplated for use as the "porous substrate" can include, but are not limited to, fiberglass, quartz, polyester fiber, polyamide fiber, polyphenylene sulfide fiber, polyetherimide fiber, cyclic olefin copolymer fiber, polyalkylene fiber, liquid crystalline polymer, poly(p-phenylene-2,6-benzobisoxazole), copolymers of polytetrafluoroethylene and perfluoromethylvinyl ether (MFA) and combinations of any two or more thereof.

As employed herein, "combination," when used to refer to polymers, embraces blends, copolymers, coplanar layers, and the like, of any two or more of the polymer or resin materials.

In accordance with still another embodiment of the present invention, there are provided laminated sheets produced by layering and molding a prescribed number of sheets of the above-described prepreg.

Laminated sheets according to the invention have many particularly beneficial properties, such as, for example, low dielectric constant, low electrical loss tangent, high thermal decomposition temperature, and the like.

In a preferred embodiment, laminated sheets according to the present invention have a dielectric constant ≤4.5 nominal, electrical loss tangent ≤0.02, and a glass transition temperature of at least 80° C.

In one aspect of the present invention, laminated sheets as described herein may optionally further comprise one or more conductive layers. Such optional conductive layers are selected from the group consisting of metal foils, metal plates, electrically conductive polymeric layers, and the like.

In accordance with yet another embodiment of the present invention, there are provided methods of making a laminated sheet, said method comprising layering and molding a prescribed number of sheets of a prepreg according to the invention.

In accordance with a further embodiment of the present invention, there are provided printed wiring boards produced by forming conductive patterns on the surface of the above-described laminated sheet(s).

In accordance with a still further embodiment of the present invention, there are provided multilayer printed wiring boards produced by layering and molding a prescribed number of sheets of the above-described patterned laminate layers, bonded together with one or more layers of prepreg from which the printed wiring board layer was prepared.

In accordance with a still further embodiment of the present invention, there are provided methods of making printed wiring boards, said methods comprising forming conductive patterns on the surface of a laminated sheet according to the invention.

In accordance with yet another embodiment of the present invention, there are provided multilayer printed wiring boards produced by layering and molding a prescribed number of sheets of the above-described prepreg, to obtain a printed wiring board for an inner layer, and layering the prepreg on the printed wiring board for an inner layer which forms conductive patterns on the surface.

In accordance with still another embodiment of the present invention, there are provided methods of making multilayer printed wiring board, said methods comprising layering and molding a prescribed number of sheets of prepreg according to the invention, to obtain a printed wiring board for an inner layer, and layering the prepreg on the printed wiring board for an inner layer which forms conductive patterns on the surface.

In accordance with yet another embodiment of the present invention, there are provided methods for improving adhesion of low-halogen, phosphorus-containing flame retardant filled triazine-based formulations to a substrate, said method comprising adding to said formulation an amount of an additional resin effective to improve the adhesion thereof to said substrate upon cure.

In accordance with yet another embodiment of the present invention, there are provided methods of adhering low-halogen, phosphorus-containing flame retardant filled triazine-based formulations to a substrate, said method comprising applying an invention composition as described herein to a suitable substrate, and curing said composition.

In accordance with yet another embodiment of the present invention, there are provided methods for improving low dielectric loss factor of low-halogen, phosphorus-containing flame retardant filled triazine-based formulations, said method comprising adding to said formulation an amount of an additional resin effective to improve the low dielectric loss factor thereof upon cure.

In accordance with yet another embodiment of the present invention, there are provided methods for improving adhesion of filled, low-halogen, phosphorus-containing flame retardant triazine-based formulations to a substrate, said method comprising replacing at least a portion of said filler with an amount of a different particulate filler effective to improve the adhesion thereof to said substrate upon cure.

In accordance with yet another embodiment of the present invention, there are provided methods for improving low dielectric loss factor of low-halogen, phosphorus-containing flame retardant triazine-based formulations, said method comprising adding to said formulation an amount of a particulate filler effective to improve the low dielectric loss factor thereof upon cure.

The invention will now be described in greater detail by reference to the following non-limiting examples.

EXAMPLE 1

Exemplary low-halogen, phosphorus-containing flame retardant filled triazine-based formulations according to the invention were prepared employing different levels of filler, as summarized in the following table. Thus, the following formulations were prepared employing standard techniques:

| Formulation | Components* |
|---|---|
| RLD II 35 | BTC-250 + Fyrol PMP + 300 phr of FB-8S |
| RLD II 37 | BTC-250 + Fyrol PMP + 200 phr of FB-8S |
| RLD II 38 | BTC-250 + Fyrol PMP + 100 phr of FB-8S |
| RLD II 39 | BTC-250 + Fyrol PMP + 0 phr of FB-8S silica |
| RLD II 36 | BTC-250 + XZ 92740** + 300 phr of FB-8S silica |

*BTC-250: Toughened Cyanate Ester resin from Lonza
Fyrol PMP: phosphorous containing halogen free flame retardant from Supresta.
FB-8S silica: spherical silica with a nominal particle size of 8 micron from Denka Corporation
**XZ92740 (non-halogenated epoxy resin) was added to the formulation at 50:50 basis with regards to BTC-250

The performance properties of each of the above-described formulations were determined employing standard techniques such as test method 2.5.5.5, as described in Book No. IPZ 10-650. Results are summarized in the following table.

| Formulation | Dk/Df (@ 10 GHz) |
|---|---|
| RLD II 35 | 3.69/.0045 |
| RLD II 37 | 3.69/0.0079 |
| RLD II 38 | 3.46/0.0062 |
| RLD II 39 | 3.23/0.0092 |
| RLD II 36 | 3.69/0.0079 |

Review of the experimental results presented above indicates that compositions according to the present invention have excellent performance properties.

Unless otherwise defined, all technical and scientific terms used herein have the same meaning as commonly understood by one of ordinary skill in the art to which this invention belongs.

The inventions illustratively described herein may suitably be practiced in the absence of any element or elements, limitation or limitations, not specifically disclosed herein. Thus, for example, the terms "comprising," "including," "containing," etc. shall be read expansively and without limitation. Additionally, the terms and expressions employed herein have been used as terms of description and not of limitation, and there is no intention in the use of such terms and expressions of excluding any equivalents of the features shown and described or portions thereof, but it is recognized that various modifications are possible within the scope of the invention claimed.

Thus, it should be understood that although the present invention has been specifically disclosed by preferred embodiments and optional features, modification, improvement and variation of the inventions embodied therein herein disclosed may be resorted to by those skilled in the art, and that such modifications, improvements and variations are considered to be within the scope of this invention. The materials, methods, and examples provided here are representative of preferred embodiments, are exemplary, and are not intended as limitations on the scope of the invention.

The invention has been described broadly and generically herein. Each of the narrower species and subgeneric groupings falling within the generic disclosure also form part of the invention. In addition, where features or aspects of the invention are described in terms of Markush groups, those skilled in the art will recognize that the invention is also thereby described in terms of any individual member or subgroup of members of the Markush group.

All publications, patent applications, patents, and other references mentioned herein are expressly incorporated by reference in their entirety, including all formulas and figures, to the same extent as if each were incorporated by reference individually. In case of conflict, the present specification, including definitions, will control.

Other embodiments are set forth within the following claims.

What is claimed is:

1. A laminate comprising:
    at least one low loss dielectric layer formed from a composition comprising:
        a first resin that forms a triazine structure upon curing,
        a second resin comprising a polyphenylene oxide,
        a substantially halogen-free, phosphorus-containing flame retardant having an atomic phosphorus content in the range of about 1-20 weight percent, based on the total weight of the resin components, and
        a quantity of a particulate filler, the particulate filler being present in a range of about 50 to about 400 parts by weight based on 100 parts by weight of the first resin and the second resin.

2. The laminate of claim 1 wherein the first resin is derived from a cyanate ester.

3. The laminate of claim 1 wherein said first resin is derived from a bisphenol-A cyanate ester, a hexafluorobisphenol-A cyanate ester, a bisphenol-E cyanate ester, a tetramethylbisphenol-F cyanate ester, a bisphenol-M cyanate ester, a phenol Novolac cyanate ester, a bisphenol-C cyanate ester, a dicyclopentadienyl-bisphenol cyanate ester, or a Novolac cyanate ester.

4. The laminate of claim 1 wherein said substantially halogen-free, phosphorus-containing compound is an organo-phosphate, a phosphonate, a phosphorus-based phenolic hardener, a phosphorus-containing cyanate ester, or a phosphorus-containing triazine.

5. The laminate of claim 4 wherein said organo-phosphate comprises at least one member selected from the group consisting of diphenyl phosphate and triphenyl phosphate.

6. The laminate of claim 1 wherein the composition further comprises at least one nitrogen-containing synergist.

7. The laminate of claim 6 wherein said at least one nitrogen-containing synergist comprises at least one member selected from the group consisting of an iso cyanurate, a urea-containing compound, a melamine-containing compound, a phosphazene-containing compound, a nitrogen-containing phenolic resin, and a nitrogen-containing epoxy resin.

8. The laminate of claim 1 wherein said particulate filler is angular, platelet, spherical, amorphous, sintered, fired, powder, flake, crystalline, ground, crushed, milled, fumed or mixtures of any two or more thereof.

9. The laminate of claim 1 wherein said particulate filler comprises at least one member selected from the group consisting of a naturally occurring mineral, a synthetic fused mineral, a treated filler, an organic polymer, a hollow sphere, a microsphere, or a powdered polymeric material.

10. The laminate of claim 1 wherein said particulate filler comprises at least one member selected from the group consisting of talc, mica, calcium carbonate, calcium sulfate, aluminum nitride, boron nitride, silicon carbide, diamond, graphite, beryllium oxide, magnesia, silica, alumina, $TiO_2$, aluminum silicate, zirconium silicate, aluminum-zirconium-silicate, cordierite, silane treated mineral, polytetrafluoroethylene, and polyphenylene sulfide.

11. The laminate of claim 1, wherein the particle size of said particulate filler falls in the range of about 500 nm up to about 300 micron.

12. The laminate of claim 1 wherein the weight ratio between the first resin and the second resin is in the range of about 1:1 to about 20:1.

13. The laminate of claim 1 wherein the atomic phosphorus content is in the range of about 1-10 wt %, based on the total weight of the first resin and the second resin.

14. The laminate of claim 1 wherein the low loss dielectric layer further comprises one or more agents selected from the group consisting of a flexibilizer, an anti-oxidant, a dye, a pigment, a surfactant, a defoamer, a silane coupling agent, a dispersing agent, a thixotropic agent, a flow modifier, a cure accelerator, a strength enhancer, a toughening agent, and a processing aid.

15. The laminate of claim 1 wherein said low loss dielectric layer has a peel strength of at least 3 pounds/inch.

16. The laminate of claim 1 wherein the low loss dielectric layer has a dielectric constant ≤4.5 when measured at 10 GHz.

17. The laminate of claim 1 wherein the low loss dielectric layer has a dielectric loss factor ≤0.02 when measured at 10 GHz.

18. The laminate of claim 16 wherein the composition has a dielectric loss factor ≤0.02 when measured at 10 GHz.

19. The laminate of claim 1 further including a substrate.

20. The laminate of claim 19 wherein the substrate is impregnated by the composition.

21. The laminate of claim 20 wherein the substrate is woven.

22. The laminate of claim 20 wherein the substrate is nonwoven.

23. The laminate of claim 20 wherein the substrate comprises at least one member selected from the group consisting of fiberglass, quartz, a polyester, a polyamide, a polyimide, a polyamide-imide, a liquid crystalline polymer (LCP), a polyphenylene sulfide (PPS), a polyalkylene, a polyphenylene oxide (PPO), a polybenzoxazoline (PBO), an Aramid, polytetrafluoroethylene, a copolymer of tetrafluoroethylene and perfluoromethylvinyl ether (MFA), and a conductive material.

24. A resin coated electrical component comprising:
a substrate,
a coating formed on the substrate, the coating being formed from a composition comprising:
  a first resin that forms a triazine structure upon curing,
  a second resin comprising a polyphenylene oxide,
  a substantially halogen-free, phosphorus-containing flame retardant having an atomic phosphorus content in the range of about 1-20 weight percent, based on the total weight of the resin components, and
  a quantity of a particulate filler, the particulate filler being present in a range of about 50 to about 400 parts by weight based on 100 parts by weight of the first resin and the second resin.

25. The electrical component of claim 24 wherein said substrate comprises a metal foil.

26. A laminated sheet produced by layering and molding a prescribed number of sheets of the electrical component of claim 24.

27. The laminated sheet of claim 26 further comprising one or more conductive layers.

28. The laminated sheet of claim 27 wherein said one or more conductive layers are selected from the group consisting of a metal foil, a metal plate, and an electrically conductive polymeric layer.

29. A printed wiring board layer produced by forming conductive patterns on the surface of the laminated sheet of claim 26.

30. A multilayer printed wiring board produced by layering and molding a prescribed number of sheets of patterned laminated sheets of claim 29, bonded together with one or more layers of pre-preg from which the printed wiring board layer was prepared.

31. A method of making a laminate comprising:
forming a low loss dielectric layer from a composition comprising:
  a first resin that forms a triazine structure upon curing,
  a second resin comprising a polyphenylene oxide,
  a substantially halogen-free, phosphorus-containing flame retardant having an atomic phosphorus content in the range of about 1-20 weight percent, based on the total weight of the resin components, and
  a quantity of a particulate filler, the particulate filler being present in a range of about 50 to about 400 parts by weight based on 100 parts by weight of the first resin and the second resin, and
curing the low loss dielectric layer.

* * * * *